US010901012B2

(12) United States Patent
Holland et al.

(10) Patent No.: US 10,901,012 B2
(45) Date of Patent: Jan. 26, 2021

(54) CALIBRATION OF CURRENT SENSE AMPLIFIER WITH COMMON-MODE REJECTION

(71) Applicant: Cirrus Logic International Semiconductor Ltd., Edinburgh (GB)

(72) Inventors: Katy Holland, Austin, TX (US); Vamsikrishna Parupalli, Austin, TX (US); Christian Larsen, Austin, TX (US); Graeme Mackay, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 40 days.

(21) Appl. No.: 16/354,781

(22) Filed: Mar. 15, 2019

(65) Prior Publication Data

US 2019/0293691 A1  Sep. 26, 2019

Related U.S. Application Data

(60) Provisional application No. 62/648,057, filed on Mar. 26, 2018.

(51) Int. Cl.
*H03F 3/45* (2006.01)
*G01R 19/10* (2006.01)
*H03F 1/02* (2006.01)

(52) U.S. Cl.
CPC .......... *G01R 19/10* (2013.01); *H03F 1/0205* (2013.01); *H03F 3/45475* (2013.01); *H03F 3/45937* (2013.01)

(58) Field of Classification Search
CPC .......... H03F 1/0205; H03F 3/45; G01R 19/10
USPC ................................ 330/2, 69, 258
See application file for complete search history.

(56) References Cited

U.S. PATENT DOCUMENTS 9,496,835 B2 * 11/2016 Creosteanu ........... H03F 1/0205

* cited by examiner

*Primary Examiner* — Steven J Mottola
(74) *Attorney, Agent, or Firm* — Jackson Walker L.L.P.

(57) ABSTRACT

A method for calculating a calibration gain used for common-mode rejection in a current sensing system may include measuring a first value of a common-mode voltage associated with the current sensing system and a first output value of the current sensing system occurring at the first value of the common-mode voltage, measuring a second value of the common-mode voltage associated with the current sensing system and a second output value of the current sensing system occurring at the second value of the common-mode voltage, and based on a difference between the second output value of the current sensing system and the first output value of the current sensing system and a difference between the second value of the common-mode voltage and the first value of the common-mode voltage, calculating the calibration gain.

16 Claims, 4 Drawing Sheets

CALIBRATION OF CURRENT SENSE AMPLIFIER WITH COMMON-MODE REJECTION

RELATED APPLICATION

The present disclosure claims priority to U.S. Provisional Patent Application Ser. No. 62/648,057, filed Mar. 26, 2018, which is incorporated by reference herein in its entirety.

FIELD OF DISCLOSURE

The present disclosure relates to current sense amplifiers. More specifically, portions of this disclosure relate to calibration of a current sense amplifier having common-mode rejection.

BACKGROUND

A current sense amplifier system may sense a current using a small sense resistor to generate a small sense voltage that is proportional to the sensed current. An amplifier of the current sense amplifier system may be used to amplify the small sense voltage and an analog-to-digital converter (ADC) may convert the analog sensed voltage signal to a digital sensed voltage signal suitable for digital post-processing.

Numerous drawbacks are associated with conventional current sense amplifier systems. For example, a common-mode voltage feedthrough may occur due to a mismatch between input resistors of the differential input of a current sense amplifier. This problem may be exacerbated by the fact that the sense voltage is small compared to the common-mode voltage, such that even a slight mismatch between such input resistors may result in a common-mode feed-through voltage that is a significant percentage of the sensed voltage. Another common problem is that the common-mode input range of the amplifier may be narrow, limiting the range of operability of the current sense amplifier system.

U.S. Pat. No. 10,132,844 (which is incorporated herein by reference in its entirety) sets forth a number of example current sense amplifiers with common-mode rejection that may overcome the problems discussed above. However, the systems and methods in U.S. Pat. No. 10,132,844 rely on determining a calibration gain setting during product test and qualification of a current sense amplifier and storing such gain setting for end use of the current sense amplifier. Thus, if characteristics of components of a current sense amplifier change from the time of gain calculation at product testing to actual amplifier operation, the calibration gain during end use may not effectively cancel out common-mode components in the current sense amplifier. Accordingly, systems and methods are desired for determining a calibration gain for common-mode rejection during actual end use of the current sense amplifier.

SUMMARY

In accordance with the teachings of the present disclosure, one or more disadvantages and problems associated with existing approaches to measuring current using a current sense amplifier may be reduced or eliminated.

In accordance with embodiments of the present disclosure, a method for calculating a calibration gain used for common-mode rejection in a current sensing system may include measuring a first value of a common-mode voltage associated with the current sensing system and a first output value of the current sensing system occurring at the first value of the common-mode voltage, measuring a second value of the common-mode voltage associated with the current sensing system and a second output value of the current sensing system occurring at the second value of the common-mode voltage, and based on a difference between the second output value of the current sensing system and the first output value of the current sensing system and a difference between the second value of the common-mode voltage and the first value of the common-mode voltage, calculating the calibration gain.

In accordance with these and other embodiments of the present disclosure, a current sensing system may include a signal path for sensing a current and a calibration engine for calculating a calibration gain used for common-mode rejection in the current sensing system. The calibration engine may be configured to measure a first value of a common-mode voltage associated with the current sensing system and a first output value of the current sensing system occurring at the first value of the common-mode voltage, measure a second value of the common-mode voltage associated with the current sensing system and a second output value of the current sensing system occurring at the second value of the common-mode voltage, and based on a difference between the second output value of the current sensing system and the first output value of the current sensing system and a difference between the second value of the common-mode voltage and the first value of the common-mode voltage, calculate the calibration gain.

Technical advantages of the present disclosure may be readily apparent to one skilled in the art from the figures, description and claims included herein. The objects and advantages of the embodiments will be realized and achieved at least by the elements, features, and combinations particularly pointed out in the claims.

It is to be understood that both the foregoing general description and the following detailed description are examples and explanatory and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

Figure 1:
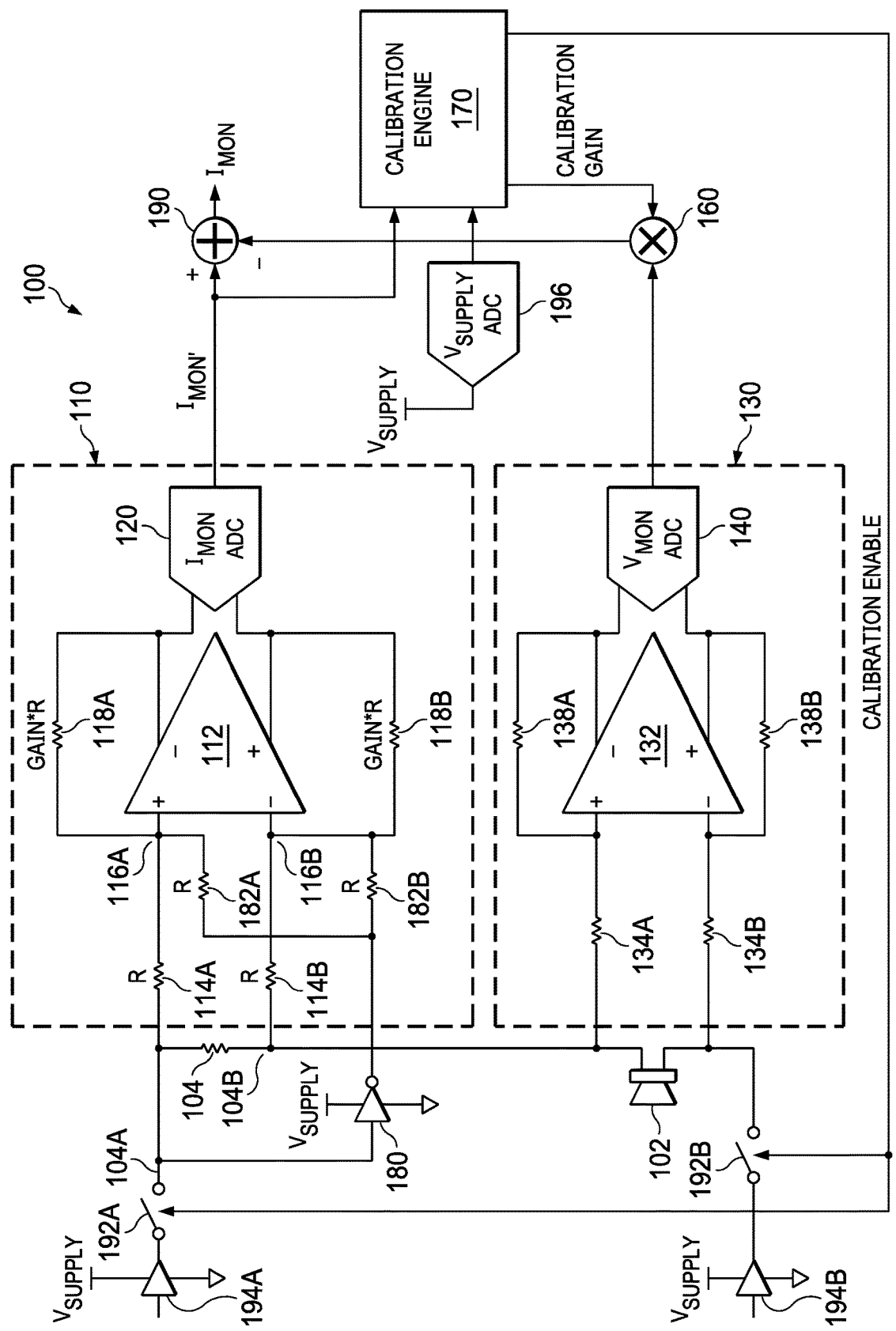
FIG. 1 illustrates a schematic block diagram of an example current sense amplifier system with common-mode rejection, enhanced wide common-mode input range, and calculation of calibration gain, in accordance with embodiments of the present disclosure.

FIG. 1 illustrates a schematic block diagram of an example current sense amplifier system 100 with common-mode rejection, enhanced wide common-mode input range, and calculation of calibration gain, in accordance with embodiments of the present disclosure. In operation, current sense amplifier system 100 may sense a current flowing through device 102, such as a transducer or any other device through which current may flow. In some embodiments, current sense amplifier system 100 may be implemented as a stand-alone circuit, as logic circuitry in a programmable device, or within a controller integrated circuit (IC). In addition, according to some embodiments, device 102 may be a transducer, such as an audio speaker, microphone, haptic resonator, or piezoelectric transducer.

Current sense amplifier system 100 may include a first ADC path 110 coupled to device 102 and configured to measure a current value. First ADC path 110 may include an amplifier 112 coupled to a sense resistor 104, such that if first ADC path 110 were uncoupled from the nodes of sense resistor 104, sense resistor 104 may be in series with device 102 (and thus, both sense resistor 104 and device 102 would have the same current). According to some embodiments, sense resistor 104 may have a small resistance, such as a resistance less than ten ohms or as small as or smaller than one ohm or one-half ohm. Thus, a voltage across sense resistor 104 generated based on the measured current through device 102 may be a small signal voltage, in some configurations having an amplitude smaller than a common-mode voltage present at the nodes of sense resistor 104.

First ADC path 110 may be coupled to the nodes of sense resistor 104 to sense a voltage across sense resistor 104 and process the sensed voltage with amplifier 112 and an analog-to-digital converter (ADC) 120. For example, first ADC path 110 may include a first resistor 114A coupled between sense resistor 104 and a first input node 116A of amplifier 112 and a second resistor 114B coupled between sense resistor 104 and a second input node 116B of amplifier 112. First resistor 114A may have an electrical resistance R approximately equal to an electrical resistance of second resistor 114B.

First ADC path 110 may also include a second signal path coupled to amplifier 112 and to first input terminal 104A. The second signal path may be configured to reduce the common-mode of the generated voltage by level shifting the generated voltage to reduce the common-mode of the voltage. For example, the second signal path may include an inverter 180 coupled to first input terminal 104A, a first resistor 182A coupled between inverter 180 and a first input 116A of amplifier 112, and a second resistor 182B coupled between inverter 180 and a second input 116B of amplifier 112. In operation, inverter 180 and resistors 182 may apply a common-mode voltage signal to inputs 116A and 116B of amplifier 112 to be added with the common-mode voltage signal applied to inputs 116A and 116B of amplifier 112 via the first signal path which comprises resistors 114A and 114B. However, because the common-mode signal applied via the second signal path is an inverse of the signal present at input terminal 104A, the summing of the voltages at inputs 116A and 116B of amplifier 112 may result in a reduction of the common-mode signal applied via the first signal path. By adding, through the second signal path, a common-mode signal to inputs 116A and 116B of amplifier 112 that is an inverse of the common-mode signal applied to inputs 116A and 116B of amplifier 112 from the first signal path, an input range of amplifier 112 may be prevented from reaching extreme values outside an operational range of amplifier 112, thus allowing the input common-mode voltage range to have a wider range than would be present without the inclusion of the second signal path.

First ADC path 110 may also include additional resistors to perform various operations on the sensed voltage of sense resistor 104. For example, first ADC path 110 may include additional resistors 118A and 118B to implement a gain function. For example, a combination of amplifier 112, resistors 114A and 114B, and resistors 118A and 118B may amplify a voltage sensed across sense resistor 104 to output to ADC 120 an amplified version of the voltage sensed across sense resistor 104 (e.g., the ratio of resistance of resistors 118A/118B to resistance of resistors 114A/114B may define a gain value of such gain function). Those of skill in the art will readily recognize that the particular gain function illustrated in FIG. 1 using amplifier 112, resistors 114A and 114B, and resistors 118A and 118B is but one embodiment of an amplifying stage which may be used in first ADC path 110. For example, more or fewer resistors may be used in collaboration with amplifier 112 to perform other gain functions in first ADC path 110.

As mentioned above, first ADC path 110 may include ADC 120, which may be coupled to an output of amplifier 112 and configured to provide a digital value to summer block 190. The digital value output by ADC 120 to summer block 190 may be representative of the voltage across sense resistor 104 generated based on the measured current value.

In some embodiments, the voltage value presented to ADC 120 by amplifier 112 may also include a common-mode feedthrough voltage $\Delta V_{cm}$. For example, $\Delta V_{cm}$ may appear at the output of amplifier 112 as a result of mismatch between resistors 114A and 114B and/or between resistors 118A and 118B. Thus, the voltage output by amplifier 112 to ADC 120 may be defined as $V_{out}+\Delta V_{cm}$, where $V_{out}$ represents the voltage output by amplifier 112 that is proportional to the current sensed by sense resistor 104 and $\Delta V_{cm}$ is the common-mode voltage fed through due to mismatches in first ADC path 110. Accordingly, the digital voltage value output by ADC 120, which is also the digital voltage value output by first ADC path 110, may be defined as $V_{out}+\Delta V_{cm}$.

Current sense amplifier system 100 may also include a second ADC path 130 to reduce the amount of common-mode voltage $\Delta V_{cm}$ propagated from ADC 120 to subsequent processing blocks. By reducing the amount of common-mode voltage $\Delta V_{cm}$ propagated to subsequent processing blocks, the digital voltage signal propagated to subsequent processing blocks may more accurately represent an amplified version of the voltage sensed across sense resistor 104.

Second ADC path 130 may be coupled to device 102 and configured to measure a common-mode value. Second ADC path 130 may include at least one component configured to perform voltage monitoring. For example, second ADC path 130 may include a differential amplifier block coupled to respective terminals of device 102. In some embodiments, such amplifier block need not perform amplification, but may instead perform attenuation, which may be considered a kind of amplification. For example, such amplifier block may be implemented with a single amplifier 132 and resistors 134A, 134B, 138A, and 138B. The configuration of resistors 134A, 134B, 138A, and 138B may be modified to perform amplification or attenuation or neither. In other words, the amplification block of second ADC path 130 may be configured to output a voltage signal representative of the common-mode voltage signal detected at an input of second ADC path 130 with or without amplifying or attenuating the signal. One of skill in the art will readily recognize that the implementation of amplification, attenuation, or voltage following illustrated in second ADC path 130 is but one configuration of an amplifying, attenuating, or voltage following function which may be used. Other configurations may be used to implement amplification, attenuation, or voltage following with the amplifier block of second ADC path 130.

Second ADC path 130 may also include an ADC 140, which may be coupled to an output of amplifier 132 and configured to provide a digital value for the measured common-mode voltage to summer block 190. In some embodiments, ADC 140 of second ADC path 130 may be configured with a dynamic range that is smaller than a dynamic range of ADC 120 of first ADC path 110.

Current sense amplifier system 100 may further include a multiplication block 160 coupled between ADC 140 and summer block 190. In addition, current sense amplifier system 100 may also include a calibration engine 170, which may generate a common-mode calibration gain, as described in greater detail below. A common-mode voltage signal that is approximately equal to $\Delta V_{cm}$ may thus be generated based on the multiplication block 160 and the common-mode calibration gain generated by calibration engine 170. For example, an output of ADC 140 may be communicated to multiplication block 160. The output signal applied to multiplication block 160 from ADC 140 may be a signal representative of the common-mode voltage detected by second ADC path 130 from node 104B. In other words, the signal applied to multiplication block 160 from ADC 140 may be the signal that results after the common-mode voltage detected by second ADC path 130 from node 104B has been processed by second ADC path 130. Thus, the signal applied to multiplication block 160 may be defined as $V_{cm}$, a common-mode voltage signal proportional to or approximately equal to the common-mode voltage detected at node 104B.

In multiplication block 160, the signal applied to multiplication block 160 may be multiplied by the calibration gain calculated by calibration engine 170 to generate a modified common-mode voltage value. For example, with the calibration gain calculated by calibration engine 170 represented as $\delta$, the output of multiplication block 160 may be represented as $\delta V_{cm}$ because, as noted above, the signal applied to multiplication block 160 may be defined as $V_{cm}$. In some embodiments, the calibration value $\delta$ generated by calibration engine 170 may be set to a value approximately equal to $\Delta$ so that the common-mode voltage signal $\delta Y_{cm}$ output by multiplication block 160 may be approximately equal in value to the common-mode feedthrough voltage signal $\Delta V_{cm}$ output by first ADC path 110. In some embodiments, calibration gain $\delta$ may be calculated by calibration engine 170 in accordance with a calibration procedure described in greater detail below. Such calibration gain $\delta$ may closely approximate an actual percentage $\Delta$ of common-mode voltage fed through in first ADC path 110, and thus calibration gain $\delta$ may be applied to multiplication block 160 to generate a modified common-mode voltage signal $\Delta V_{cm}$ that is approximately equal to $\Delta V_{cm}$.

Current sense amplifier system 100 may also include summer block 190 to allow the reduction of the feedthrough common-mode voltage from the voltage signal $V_{out}+\Delta V_{cm}$ output by first ADC path 110. Summer block 190 may be coupled to first ADC path 110, second ADC path 130, and calibration engine 170. To implement the enhanced common-mode rejection functionality of current sense amplifier system 100, summer block 190 may be configured to output a voltage proportional to the measured current through the device by correcting a voltage value output by first ADC path 110 based, at least in part, on the measured common-mode value of second ADC path 130 and the calculated calibration gain. For example, summer block 190 may receive as inputs the voltage signal $V_{out}+\Delta V_{cm}$ output by first ADC path 110 and voltage signal $\delta V_{cm}$ output by multiplication block 160. Summer block 190 may subtract $\delta V_{cm}$ from $V_{out}+\Delta V_{cm}$ so that the output of summer block 190 may be defined as $V_{out}+\Delta V_{cm}-\delta V_{cm}$. When $\delta$ accurately approximates $\Delta$, then the output of summer block 190 may be reduced to simply $V_{out}$, a voltage signal that is primarily a voltage proportional to a current measured through sense resistor 104. Thus, in some embodiments, summer block 190 may be configured to subtract the modified common-mode voltage value $\delta V_{cm}$ from the output $V_{out}+\Delta V_{cm}$ of first ADC path 110 to compensate for mismatches in first ADC path 110, such as a mismatch between first resistor 114A and second resistor 114B and/or a mismatch between resistors 118A and 118B, for example.

The monitored current output $I_{MON}$ produced by summer block 190 may be fed to other systems for processing and performing of additional functions. For example, in embodiments in which device 102 is an audio transducer, an output of summer block 190 may be coupled to a speaker protection circuit, a speaker linearization circuit, and/or other suitable audio processing circuit. In another example, in embodiments in which device 102 is a haptic feedback device, an output of summer block 190 may be coupled to a haptic control circuit.

Turning again to discussion of calibration engine 170, calibration engine 170 may be configured to, during a calibration phase of current sense amplifier system 100, perform a calibration procedure in order to calculate a calibration gain to be applied to multiplier block 160. Such calibration procedure may occur during a calibration phase of current sense amplifier system 100. Such a calibration phase may be configured to occur upon startup of current sense amplifier system 100 or a device comprising current sense amplifier system 100. In operation, during a calibration phase of current sense amplifier system 100, calibration engine 170 may measure a plurality of values of a common-mode voltage of current sense amplifier system 100 and for each respective value of the plurality of values, measure a corresponding output value generated by ADC 120. Based on one or more differences between the measured output values of ADC 120 and one or more differences between the measured values of the common-mode voltage, calibration engine 170 may calculate the calibration gain. For example, in some embodiments, calibration engine 170 may measure a first value of the common-mode voltage (e.g., a full-scale supply rail voltage) and a first output value of ADC 120 occurring at the first value of the common-mode voltage, and may measure a second value of the common-mode voltage (e.g., another voltage other than full-scale supply rail voltage) and a second output value of ADC 120 occurring at the second value of the common-mode voltage. Comparison of a difference between the second output value of the current sensing system and the first output value of the current sensing system and a difference between the second value of the common-mode voltage and the first value of the common-mode voltage may give an indication of the common-mode error present at ADC 120, from which calibration engine 170 may determine the calibration gain needed to be applied to multiplier block 160 in order to compensate for common-mode signal appearing at the output of ADC 120. The second value of the common-mode voltage may differ from the first value of the common-mode voltage in at least one of polarity and magnitude.

In such embodiments, calibration engine 170 may measure a third value of the common-mode voltage and a third output value of the current sensing system occurring at the third value of the common-mode voltage. Comparison of a difference between the third output value and the first output value (or the second output value) and a difference between the third value of the common-mode voltage and the first value (or the second value) of the common-mode voltage may give a further indication of the common-mode error present at ADC 120, from which calibration engine 170 may further determine the calibration gain needed to be applied to multiplier block 160 in order to compensate for common-mode signal appearing at the output of ADC 120.

Additional measurements of other values of common-mode voltage and corresponding output values from ADC 120 may allow for more accurate calculation of calibration gain. For example, in some embodiments, calibration engine 170 may sweep through numerous values of common-mode voltage, and measure such values and corresponding output values of ADC 120 to calculate a calibration gain.

In order to perform the calibration procedure, current sense amplifier system 100 may employ a voltage supply decoupled from a system noise of current sense amplifier system 100 to generate a supply voltage $V_{SUPPLY}$ as shown in multiple locations in FIG. 1. In some embodiments, such voltage supply may comprise a high-output impedance boosted charge pump with a pre-charged capacitor. In order to measure the common-mode voltage during the calibration procedure, a current sense amplifier system 100 may include an ADC 196 to convert the analog supply voltage $V_{SUPPLY}$ to an equivalent digital signal received by calibration engine 170.

As also shown in FIG. 1, during the calibration phase, calibration engine 170 may assert a calibration enable signal to activate (e.g., enable, close, turn on) switches 192A and 192B, in order to couple an output of amplifier 194A to a first terminal of current sense amplifier system 100 and/or couple an output of amplifier 194B to a second terminal of current sense amplifier system 100. Outside of the calibration phase, such terminals of current sense amplifier system 100 may be coupled to another device, such as an amplifier for driving device 102.

Amplifier 194A and/or amplifier 194B may apply the same voltage at both input terminals of current sense amplifier system 100 during the calibration phase in order to prevent inducing a signal in a differential load (e.g., device 102) that might cause a measurement error or in the case of an audio system, might cause audible artifacts of the calibration procedure to be heard by a listener. Advantageously, amplifiers 194A and 194B may have high-output impedances, such that presence of amplifiers 194A and 194B creates little or no measurement error. In some of such embodiments, calibration engine 170 may cause one of the terminals of current sense amplifier system 100 to be decoupled, creating an open circuit (e.g., floating terminal) at such terminal during the calibration phase to prevent a differential load (e.g., device 102) from causing an error current to flow, which may lead to measurement error.

Thus, in a calibration phase, the voltage $V_{SUPPLY}$ applied to amplifier 194A, amplifier 194B, inverter 180, and ADC 196 may be varied among a plurality of values and measurements of common-mode voltage (output of ADC 196) and current sense output (output of ADC 120) may be taken at each of the plurality of values of voltage $V_{SUPPLY}$, in order to determine the calibration gain to be applied to multiplier block 160.

In some embodiments, voltage $V_{SUPPLY}$ may be varied during the calibration phase in an amount sufficient that the calibration gain is scaled for a full scale signal range of current sense amplifier system 100.

Although FIG. 1 represents particular embodiments of a current sense amplifier system, other suitable embodiments of a current sense amplifier system may be used, including without limitation current sense amplifier systems similar to those described in U.S. Pat. No. 10,132,844.

Figure 2:
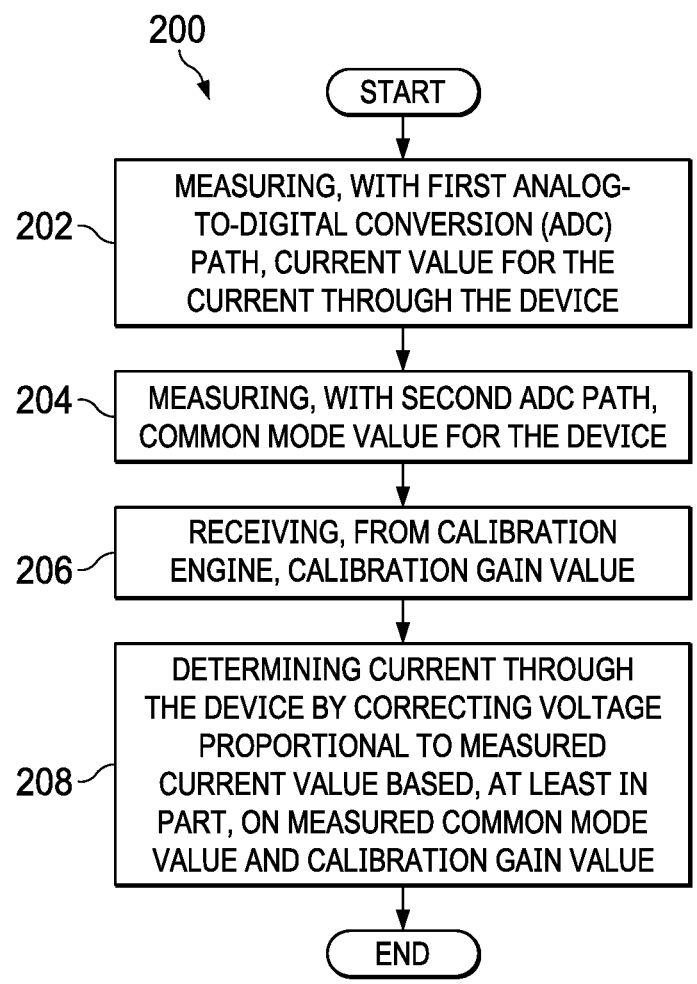
FIG. 2 is a flow chart illustrating an example method for measuring a current through a device, in accordance with embodiments of the present disclosure.

FIG. 2 is a flow chart illustrating a method for measuring a current through a device (e.g., device 102) according to one embodiment of the disclosure. Method 200 may be implemented with the system described with respect to FIG. 1 or any other suitable system.

Method 200 may begin at step 202, in which a first ADC path (e.g., first ADC path 110) may measure a current value for the current through the device. At step 204, a second ADC path (e.g., second ADC path 130) may measure a common-mode value for the device. In some embodiments, a sense resistor (e.g., sensor resistor 104) in series with the device may be used in conjunction with the first ADC path to measure the current value. Thus, in such embodiments, measuring the current value may include sensing, with an amplifier (e.g., amplifier 112), a voltage proportional to a current through the sense resistor. In such embodiments, an ADC (e.g., ADC 120) may be used to convert the analog signal at the output of the amplifier to a digital signal for determining the current.

At step 206, a calibration gain may be received from a calibration engine (e.g., calibration engine 170). At step 208, a current sense amplifier system may determine the current through the device by correcting a voltage proportional to the measured current value based, at least in part, on the measured common-mode value and the calibration gain. In some embodiments, the step of correcting the voltage proportional to the measured current value may include correcting for a resistor mismatch (e.g., mismatch between resistors 114A and 114B and/or resistors 118A and 118B) in the first ADC path.

In some embodiments, speaker protection may be performed by a current sense amplifier system implementing method 200 based, at least in part, on the determined current through the device. In another embodiment, speaker linearization may be performed based, at least in part, on the determined current through the device. In yet another embodiment, haptic feedback may be provided based, at least in part, on the determined current through the device.

Figure 3:
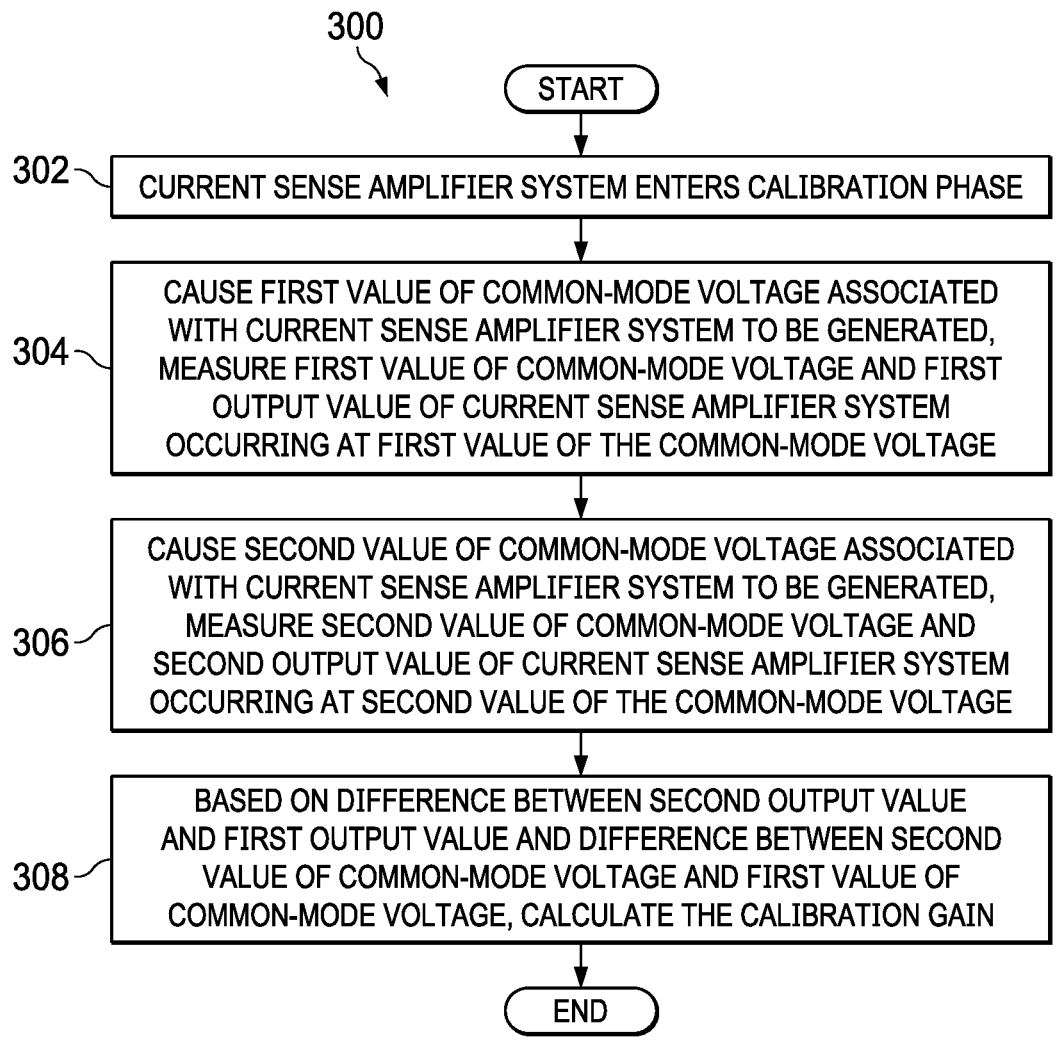
FIG. 3 is a flow chart illustrating an example method for calculation of a calibration gain, in accordance with embodiments of the present disclosure.

FIG. 3 is a flow chart illustrating an example method for calculation of a calibration gain, in accordance with embodiments of the present disclosure. Method 300 may be implemented with the system described with respect to FIG. 1 or any other suitable system.

Method 300 may begin at step 302, in which a current sense amplifier system (e.g., current sense amplifier system 100) enters a calibration phase. In some embodiments, such calibration phase may be entered upon startup of a current sense amplifier system or a device comprising the current sense amplifier system. At step 304, the current sense amplifier system may cause a first value of a common-mode voltage associated with the current sense amplifier system to be generated (e.g., by setting voltage $V_{SUPPLY}$ to a desired value) and measure the first value of a common-mode voltage (e.g., from the output of ADC 196) and a first output value of the current sense amplifier system occurring at the first value of the common-mode voltage (e.g., from the output of ADC 140). At step 306, the current sense amplifier system may cause a second value of a common-mode voltage associated with the current sense amplifier system to be generated (e.g., by setting voltage $V_{SUPPLY}$ to a desired value) and measure the second value of a common-mode voltage (e.g., from the output of ADC 196) and a second output value of the current sense amplifier system occurring at the first value of the common-mode voltage (e.g., from the output of ADC 140). Although not shown in FIG. 3, the current sense amplifier system may take additional measurements of values of common-mode voltage and respective output values of the current sense amplifier system. At step 308, based on a difference between the second output value of the current sensing system and the first output value of the current sensing system (and differences associated with any additional measurements) and a difference between the second value of the common-mode voltage and the first value of the common-mode voltage (and differences associated with any additional measurements), the current sense amplifier system may calculate the calibration gain.

The schematic flow chart diagrams of FIGS. 2 and 3 are generally set forth as logical flow chart diagrams. As such, the depicted order and labeled steps are indicative of aspects of the disclosed methods. Other steps and methods may be conceived that are equivalent in function, logic, or effect to one or more steps, or portions thereof, of the illustrated methods. Additionally, the format and symbols employed are provided to explain the logical steps of the methods and are understood not to limit the scope of the methods. Although various arrow types and line types may be employed in the flow chart diagram, they are understood not to limit the scope of the corresponding methods. Indeed, some arrows or other connectors may be used to indicate only the logical flow of the methods. For instance, an arrow may indicate a waiting or monitoring period of unspecified duration between enumerated steps of the depicted methods. Additionally, the order in which a particular method occurs may or may not strictly adhere to the order of the corresponding steps shown.

Figure 4:
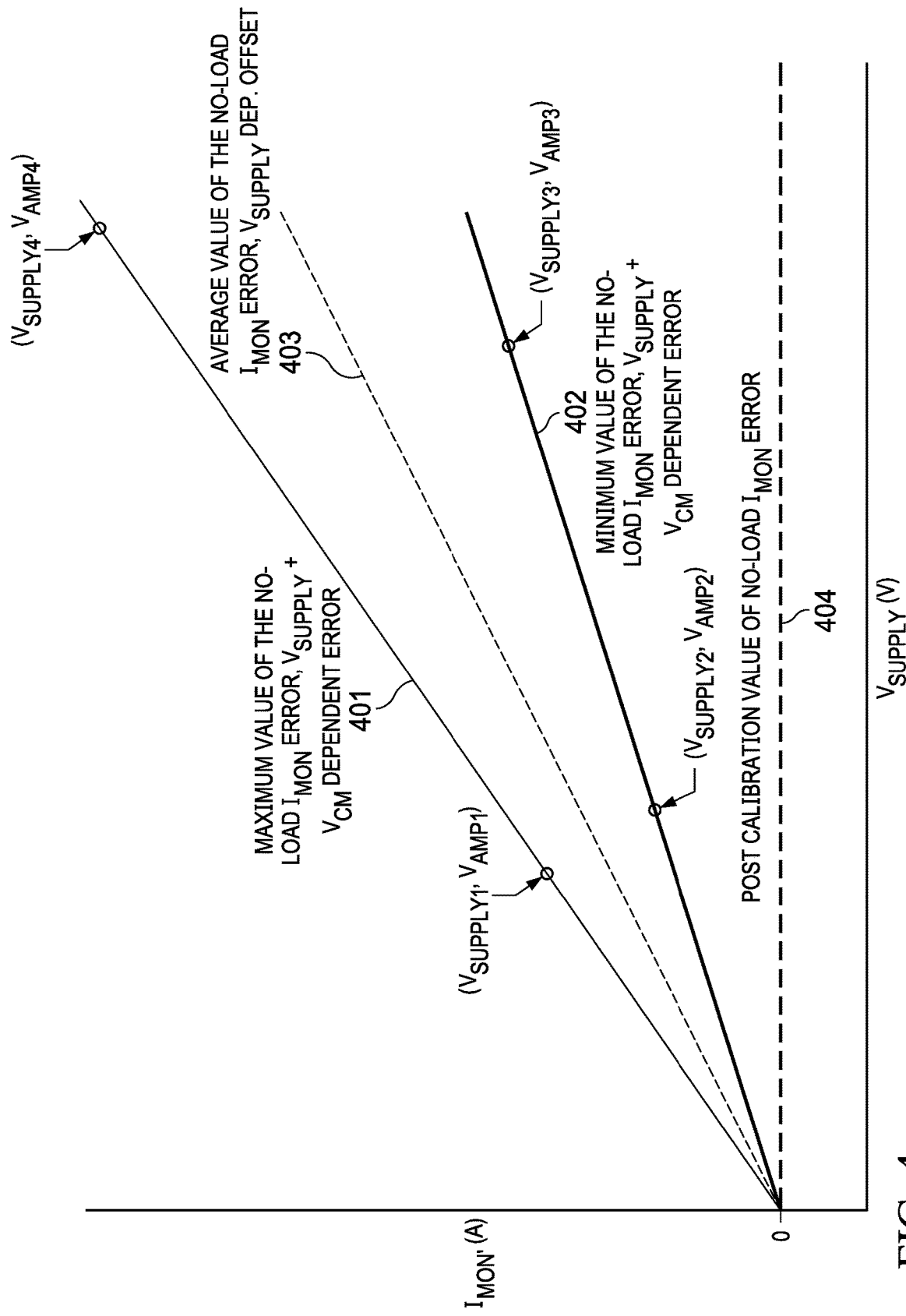
FIG. 4 illustrates example values for non-calibrated current $I_{MON}'$ depicted in FIG. 1 as a function of supply voltage $V_{SUPPLY}$, in accordance with embodiments of the present disclosure.

To further illustrate the calibration procedure described above, reference is made to FIG. 4, which illustrates example values for non-calibrated current $I_{MON}'$ depicted in FIG. 1 as a function of supply voltage $V_{SUPPLY}$. In the case where amplifier 112 has a different DC common mode output and input level influenced by supply voltage $V_{SUPPLY}$, resistor mismatch of first ADC path 110 (e.g., mismatch of resistors 114A and 114B, mismatch of resistors 118A and 118B, and mismatch of resistors 182A and 182B) may cause $V_{SUPPLY}$-dependent offset error 403 shown in FIG. 4 and common-mode rejection mode error 401, 402, as also shown in FIG. 4. Linear curve 401 may represent a maximum value of $V_{SUPPLY}$-dependent, $\Delta V_{cm}$-dependent error in non-calibrated current signal $I_{MON}'$, linear curve 402 may represent a minimum value of $V_{SUPPLY}$-dependent, $\Delta V_{cm}$-dependent error in non-calibrated current signal $I_{MON}'$, and linear curve 403 may represent an average value of $V_{SUPPLY}$-dependent error in non-calibrated current signal $I_{MON}$.

In a case in which it can be ensured that a first value $I_{MON1}'$ and a second value $I_{MON2}'$ of the output of ADC 120 are measured at the exact same level of supply voltage $V_{SUPPLY}$, then the two-point calibration described in method 300 may be used to determine a CMRR coefficient as follows:

$$CMRR = \frac{I_{MON1}' - I_{MON2}'}{2V_{SUPPLY}}$$

However, in field operations, where a constant supply voltage $V_{SUPPLY}$ cannot be ensured, then a four-point measurement may be used to calculate a CMRR coefficient C, a $V_{SUPPLY}$-dependent offset coefficient B, and nominal zero-common mode offset A as shown in the equations below, in which various example measured values of supply voltage $V_{SUPPLY1}$, $V_{SUPPLY2}$, $V_{SUPPLY3}$, and $V_{SUPPLY4}$ are shown in FIG. 4 as are respective example measured values of amplifier 112 output voltage $V_{AMP1}$, $V_{AMP2}$, $V_{AMP3}$, and $V_{AMP4}$ corresponding to the measured supply voltages:

$$I_{MON1}' = A + BV_{SUPPLY1} - CV_{SUPPLY1}$$

$$I_{MON2}' = A + BV_{SUPPLY2} = CV_{SUPPLY2}$$

$$I_{MON3}' = A + BV_{SUPPLY3} \times CV_{SUPPLY3}$$

$$I_{MON4}' = A + BV_{SUPPLY4} + CV_{SUPPLY4}$$

and thus:

$$C = \frac{I_{MON3}' - I_{MON2}'}{2(V_{SUPPLY3} - V_{SUPPLY2})} - \frac{I_{MON4}' - I_{MON1}'}{2(V_{SUPPLY4} - V_{SUPPLY1})}$$

$$B = \frac{I_{MON3}' - I_{MON2}'}{2(V_{SUPPLY3} - V_{SUPPLY2})} + \frac{I_{MON4}' - I_{MON1}'}{2(V_{SUPPLY4} - V_{SUPPLY1})}$$

$$A = \frac{(I_{MON2}' + I_{MON3}') - BC(V_{SUPPLY2} + V_{SUPPLY3})}{2}$$

These various parameters may then be used by calibration engine 170 to calculate a calibration gain to be applied to multiplication block 160.

If implemented in firmware and/or software, functions described above may be stored as one or more instructions or code on a computer-readable medium. Examples include non-transitory computer-readable media encoded with a data structure and computer-readable media encoded with a computer program. Computer-readable media includes physical computer storage media. A storage medium may be any available medium that can be accessed by a computer. By way of example, and not limitation, such computer-readable media can comprise random access memory (RAM), read-only memory (ROM), electrically-erasable programmable read-only memory (EEPROM), compact disc read-only memory (CD-ROM) or other optical disk storage, magnetic disk storage or other magnetic storage devices, or any other medium that can be used to store desired program code in the form of instructions or data structures and that can be accessed by a computer. Disk and disc includes compact discs (CD), laser discs, optical discs, digital versatile discs (DVD), floppy disks and Blu-ray discs. Generally, disks reproduce data magnetically, and discs reproduce data optically. Combinations of the above should also be included within the scope of computer-readable media.

In addition to storage on computer readable media, instructions and/or data may be provided as signals on transmission media included in a communication apparatus. For example, a communication apparatus may include a transceiver having signals indicative of instructions and data. The instructions and data may be configured to cause one or more processors to implement the functions outlined in the claims.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative. Accordingly, modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

Although exemplary embodiments are illustrated in the figures and described below, the principles of the present disclosure may be implemented using any number of techniques, whether currently known or not. The present disclosure should in no way be limited to the exemplary implementations and techniques illustrated in the drawings and described above.

Unless otherwise specifically noted, articles depicted in the drawings are not necessarily drawn to scale.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

Although specific advantages have been enumerated above, various embodiments may include some, none, or all of the enumerated advantages. Additionally, other technical advantages may become readily apparent to one of ordinary skill in the art after review of the foregoing figures and description.

To aid the Patent Office and any readers of any patent issued on this application in interpreting the claims appended hereto, applicants wish to note that they do not intend any of the appended claims or claim elements to invoke 35 U.S.C. § 112(f) unless the words "means for" or "step for" are explicitly used in the particular claim.

What is claimed is:

1. A method for calculating a calibration gain used for common-mode rejection in a current sensing system, comprising:
    measuring a first value of a common-mode voltage associated with the current sensing system and a first output value of the current sensing system occurring at the first value of the common-mode voltage; and
    measuring a second value of the common-mode voltage associated with the current sensing system and a second output value of the current sensing system occurring at the second value of the common-mode voltage;
    measuring a third value of the common-mode voltage associated with the current sensing system and a third output value of the current sensing system occurring at the third value of the common-mode voltage;
    measuring a fourth value of the common-mode voltage associated with the current sensing system and a fourth output value of the current sensing system occurring at the fourth value of the common-mode voltage; and
    based on the first value of a common-mode voltage, the first output value of the current sensing system, the second value of a common-mode voltage, the second output value of the current sensing system, the third value of a common-mode voltage, the third output value of the current sensing system, the fourth value of a common-mode voltage, and the fourth output value of the current sensing system, calculating the calibration gain.

2. The method of claim 1, wherein calculating the calibration gain comprises:
    based on the first value of a common-mode voltage, the first output value of the current sensing system, the second value of a common-mode voltage, the second output value of the current sensing system, the third value of a common-mode voltage, the third output value of the current sensing system, the fourth value of a common-mode voltage, and the fourth output value of the current sensing system:
        determining a common-mode rejection ratio coefficient;
        determining a supply voltage-dependent offset coefficient; and
        determining a zero-common mode offset; and
    based on the common-mode rejection ratio coefficient, the supply voltage-dependent offset coefficient, and the zero-common mode offset, calculating the calibration gain.

3. A method for calculating a calibration gain used for common-mode rejection in a current sensing system, comprising:
    measuring a first value of a common-mode voltage associated with the current sensing system and a first output value of the current sensing system occurring at the first value of the common-mode voltage; and
    measuring a second value of the common-mode voltage associated with the current sensing system and a second output value of the current sensing system occurring at the second value of the common-mode voltage;
    generating the common-mode voltage using a voltage supply decoupled from system noise of the current sensing system; and
    based on a difference between the second output value of the current sensing system and the first output value of the current sensing system and a difference between the second value of the common-mode voltage and the first value of the common-mode voltage, calculating the calibration gain.

4. The method of claim 3, wherein voltage supply comprises a high output impedance boosted charge pump with a pre-charged capacitor.

5. The method of claim 3, further comprising measuring the common-mode voltage by performing analog-to-digital conversion of a voltage generated by the voltage supply.

6. A method for calculating a calibration gain used for common-mode rejection in a current sensing system, comprising:
- measuring a first value of a common-mode voltage associated with the current sensing system and a first output value of the current sensing system occurring at the first value of the common-mode voltage; and
- measuring a second value of the common-mode voltage associated with the current sensing system and a second output value of the current sensing system occurring at the second value of the common-mode voltage;
- applying the same voltage at both input terminals of the current sensing system during a calibration procedure for calculating the calibration gain in order to prevent inducing a signal in a differential load associated with the current sensing system; and
- based on a difference between the second output value of the current sensing system and the first output value of the current sensing system and a difference between the second value of the common-mode voltage and the first value of the common-mode voltage, calculating the calibration gain.

7. The method of claim 6, further comprising decoupling one of the terminals of the current sensing system creating an open circuit at such terminal during the calibration procedure to prevent the differential load from causing an error current to flow through the current sensing system.

8. The method of claim 7, wherein the calibration gain is scaled for a full scale signal range of the current sensing system.

9. A current sensing system, comprising:
- a signal path for sensing a current; and
- a calibration engine for calculating a calibration gain used for common-mode rejection in the current sensing system, wherein the calibration engine is configured to:
  - measure a first value of a common-mode voltage associated with the current sensing system and a first output value of the current sensing system occurring at the first value of the common-mode voltage; and
  - measure a second value of the common-mode voltage associated with the current sensing system and a second output value of the current sensing system occurring at the second value of the common-mode voltage;
  - measure a third value of the common-mode voltage associated with the current sensing system and a third output value of the current sensing system occurring at the third value of the common-mode voltage;
  - measure a fourth value of the common-mode voltage associated with the current sensing system and a fourth output value of the current sensing system occurring at the fourth value of the common-mode voltage; and
  - based on the first value of a common-mode voltage, the first output value of the current sensing system, the second value of a common-mode voltage, the second output value of the current sensing system, the third value of a common-mode voltage, the third output value of the current sensing system, the fourth value of a common-mode voltage, and the fourth output value of the current sensing system, calculate the calibration gain.

10. The current sensing system of claim 9, wherein calculating the calibration gain comprises:
- based on the first value of a common-mode voltage, the first output value of the current sensing system, the second value of a common-mode voltage, the second output value of the current sensing system, the third value of a common-mode voltage, the third output value of the current sensing system, the fourth value of a common-mode voltage, and the fourth output value of the current sensing system:
  - determining a common-mode rejection ratio coefficient;
  - determining a supply voltage-dependent offset coefficient; and
  - determining a zero-common mode offset; and
- based on the common-mode rejection ratio coefficient, the supply voltage-dependent offset coefficient, and the zero-common mode offset, calculating the calibration gain.

11. A current sensing system comprising:
- a signal path for sensing a current; and
- a calibration engine for calculating a calibration gain used for common-mode rejection in the current sensing system, wherein the calibration engine is configured to:
  - measure a first value of a common-mode voltage associated with the current sensing system and a first output value of the current sensing system occurring at the first value of the common-mode voltage; and
  - measure a second value of the common-mode voltage associated with the current sensing system and a second output value of the current sensing system occurring at the second value of the common-mode voltage; and
  - based on a difference between the second output value of the current sensing system and the first output value of the current sensing system and a difference between the second value of the common-mode voltage and the first value of the common-mode voltage, calculate the calibration gain; and
- a voltage supply decoupled from system noise of the current sensing system for generating the common-mode voltage.

12. The current sensing system of claim 11, wherein the voltage supply comprises a high output impedance boosted charge pump with a pre-charged capacitor.

13. The current sensing system of claim 11, further comprising an analog-to-digital converter configured to perform analog-to-digital conversion of a voltage generated by the voltage supply in order to measure the common-mode voltage.

14. A current sensing system comprising:
- a signal path for sensing a current; and
- a calibration engine for calculating a calibration gain used for common-mode rejection in the current sensing system, wherein the calibration engine is configured to:
  - measure a first value of a common-mode voltage associated with the current sensing system and a first output value of the current sensing system occurring at the first value of the common-mode voltage; and
  - measure a second value of the common-mode voltage associated with the current sensing system and a second output value of the current sensing system occurring at the second value of the common-mode voltage; and
  - based on a difference between the second output value of the current sensing system and the first output value of the current sensing system and a difference between the second value of the common-mode voltage and the first value of the common-mode voltage, calculate the calibration gain; and control circuitry configured to apply the same voltage at both input terminals of the current sensing system during a calibration procedure for calculating the calibration gain in order to prevent inducing a signal in a differential load associated with the current sensing system.

15. The current sensing system of claim 14, further comprising control circuitry configured to decouple one of the terminals of the current sensing system creating an open circuit at such terminal during the calibration procedure to prevent the differential load from causing an error current to flow through the current sensing system.

16. The current sensing system of claim 15, wherein the calibration gain is scaled for a full scale signal range of the current sensing system.

* * * * *

UNITED STATES PATENT AND TRADEMARK OFFICE
CERTIFICATE OF CORRECTION

PATENT NO. : 10,901,012 B2
APPLICATION NO. : 16/354781
DATED : January 26, 2021
INVENTOR(S) : Holland et al.

It is certified that error appears in the above-identified patent and that said Letters Patent is hereby corrected as shown below:

In the Claims

1. In Column 11, Line 67, in Claim 1, delete "voltage; and" and insert -- voltage; --, therefor.

2. In Column 13, Line 31, in Claim 9, delete "system," and insert -- system --, therefor.

3. In Column 13, Line 39, in Claim 9, delete "voltage; and" and insert -- voltage; --, therefor.

Signed and Sealed this
Eighth Day of November, 2022

Katherine Kelly Vidal
*Director of the United States Patent and Trademark Office*